United States Patent
Kitahara et al.

(10) Patent No.: US 8,116,084 B2
(45) Date of Patent: Feb. 14, 2012

(54) METHOD FOR MANUFACTURING POWER MODULE SUBSTRATE, POWER MODULE SUBSTRATE, AND POWER MODULE

(75) Inventors: Takeshi Kitahara, Gotenba (JP); Yoshiyuki Nagatomo, Gotenba (JP); Toshiyuki Nagase, Gotenba (JP); Yoshirou Kuromitsu, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 12/734,646

(22) PCT Filed: Nov. 19, 2008

(86) PCT No.: PCT/JP2008/071018
§ 371 (c)(1),
(2), (4) Date: May 13, 2010

(87) PCT Pub. No.: WO2009/066692
PCT Pub. Date: May 28, 2009

(65) Prior Publication Data
US 2010/0285331 A1 Nov. 11, 2010

(30) Foreign Application Priority Data
Nov. 19, 2007 (JP) ................................. 2007-299385

(51) Int. Cl.
*H05K 1/00* (2006.01)
(52) U.S. Cl. ........ 361/748; 361/704; 361/709; 361/711; 361/739; 361/820; 174/252; 174/258; 428/209; 428/210; 428/545; 428/650; 428/701; 257/691; 257/706

(58) Field of Classification Search .................. 361/748, 361/704, 709, 739, 711, 820; 174/252, 258; 428/209, 210, 545, 650, 701; 257/691, 706
See application file for complete search history.

(56) References Cited

U.S. PATENT DOCUMENTS

| | | | | |
|---|---|---|---|---|
| 5,213,877 A | * | 5/1993 | Yoshida et al. | 428/209 |
| 5,436,080 A | | 7/1995 | Inoue et al. | |
| 5,675,474 A | * | 10/1997 | Nagase et al. | 361/704 |
| 6,033,787 A | * | 3/2000 | Nagase et al. | 428/545 |
| 6,483,185 B1 | * | 11/2002 | Nagase et al. | 257/706 |
| 2004/0022029 A1 | * | 2/2004 | Nagatomo et al. | 361/709 |

(Continued)

FOREIGN PATENT DOCUMENTS

JP 03-234045 A 10/1991
(Continued)

OTHER PUBLICATIONS

Office Action for Japanese Patent Application No. 2008-294598 issued Feb. 1, 2011.
(Continued)

*Primary Examiner* — Xiaoliang Chen
(74) *Attorney, Agent, or Firm* — Edwards Wildman Palmer LLP (57) ABSTRACT

A method for manufacturing a power module substrate, includes: preparing a ceramics substrate and a metal plate made of pure aluminum; a fusion step in which the ceramics substrate and the metal plate are stacked in layers with a brazing filler metal interposed therebetween, and a fused aluminum layer is formed at an interface between the ceramics substrate and the metal plate by fusing the brazing filler metal which is caused by heating; and a solidifying step in which the fused aluminum layer is solidified by cooling, and a crystal is grown so as to be arranged in a crystal orientation of the metal plate when the fused aluminum layer is solidified.

4 Claims, 9 Drawing Sheets

U.S. PATENT DOCUMENTS

| | | |
|---|---|---|
| 2005/0214518 A1 * | 9/2005 | Nagase et al. ................ 428/210 |
| 2007/0274047 A1 | 11/2007 | Nagase et al. |

FOREIGN PATENT DOCUMENTS

| | | |
|---|---|---|
| JP | 05-171313 A | 7/1993 |
| JP | 07-172961 A | 7/1995 |
| JP | 2000-340897 | 12/2000 |
| JP | 2007-258416 | 10/2007 |
| WO | WO-2005/098942 A1 | 10/2005 |

OTHER PUBLICATIONS

International Search Report dated Jan. 6, 2009, issued on PCT/JP2008/071018.

* cited by examiner

METHOD FOR MANUFACTURING POWER MODULE SUBSTRATE, POWER MODULE SUBSTRATE, AND POWER MODULE

BACKGROUND OF THE INVENTION

1. Field of the Invention

The present invention relates to a method for manufacturing a power module substrate which is used for a semiconductor device controlling high electrical current and high voltage, a power module substrate, and a power module.

This application is based on and claims priority from Japanese Patent Application No. 2007-299385, filed on Nov. 19, 2007, the contents of which are incorporated herein by reference.

2. Background Art

In semiconductor elements, it is known that a power module used for supplying electrical power has an amount of heat generation, and the amount of heat generation is relatively high.

Consequently, as a substrate on which the power module is mounted, for example, a power module substrate is used in which a metal plate made of Al (aluminum) is joined to a ceramics substrate made of AlN (aluminum nitride) with an Al—Si (silicon) based brazing filler metal interposed therebetween.

In addition, the metal plate is formed as a circuit layer, a semiconductor chip of the power element is mounted on the metal plate with a solder material interposed therebetween.

Moreover, a power module has been proposed, in which a metal layer to which a metal plate made of Al or the like is joined is also formed on a lower face of the ceramics substrate for heat radiation and in which a whole power module substrate is joined to a heat radiation plate with the metal layer interposed therebetween.

Conventionally, a technique has been disclosed in, for example, Japanese Unexamined Patent Application, First Publication No. 1103-234045, in which the roughness surface of an AlN ceramics substrate is less than 0.5 μm in order to obtain an excellent joint strength between a metal plate which serves as the circuit layer and the metal layer and a ceramics substrate.

However, when the metal plate is joined to the ceramics substrate, even if the roughness surface of the ceramics substrate is simply reduced, a sufficiently-high joint strength is not obtained and there is a disadvantage in that the reliability thereof cannot be improved.

Even if, for example, a honing treatment is performed on the surface of the ceramics substrate by use of $Al_2O_3$ particles in a dry method and the roughness surface Ra thereof is made 0.2 μm, it was found that a peeling occurs at an interface thereof in a peeling test.

In addition, even if the roughness surface Ra is made less than or equal to 0.1 μm by use of a polishing method, there is a case where the peeling occurs at the interface in a similar manner.

Specifically, in recent days, in the power module, downsizing and reducing the thickness advances, and the usage environment becomes severe. Therefore, electronic components having a high amount of heat generation are generally used further.

Consequently, it is necessary to dispose a power module substrate on a heat radiation plate as described above.

In this case, since the power module substrate is rigidly fixed by the heat radiation plate, a large shear force is generated at a joint interface between the metal plate and the ceramics substrate when the substrate is subjected to thermal cycles.

As a result, improvement of the joint strength and reliability are further required.

SUMMARY OF THE INVENTION

The invention was made with respect to the above-described situation, and has an object to provide a method for manufacturing a power module substrate, a power module substrate, and a power module in which the power module substrate is used, where propagation of fractures at a joint interface between the metal plate and the ceramics substrate or in vicinity of the joint interface is prevented, and a high joint strength is obtained.

In order to solve the above-described problems and achieve the object, a method for manufacturing a power module substrate of the invention includes: preparing a ceramics substrate and a metal plate made of pure aluminum; a fusion step in which the ceramics substrate and the metal plate are stacked in layers with a brazing filler metal interposed therebetween, and a fused aluminum layer is formed at an interface between the ceramics substrate and the metal plate by fusing the brazing filler metal which is caused by heating; and a solidifying step in which the fused aluminum layer is solidified by cooling, and a crystal is grown so as to be arranged in a crystal orientation of the metal plate when the fused aluminum layer is solidified.

In the method for manufacturing the power module substrate, the method includes: the fusion step in which the fused aluminum layer is formed by fusing the brazing filler metal that is disposed between the metal plate made of pure aluminum and the ceramics substrate; and the solidifying step in which the crystal is grown so as to be arranged in a crystal orientation of the metal plate when the fused aluminum layer is solidified by cooling. Therefore, in the vicinity of the joint interface between the metal plate and the ceramics substrate, a crystalline grain is formed along the crystal of the metal plate, and the boundary between the metal plate and the ceramics substrate thereby becomes unclear.

Namely, the fused aluminum layer that is formed by fusing the brazing filler is joined to the metal plate in an integrated manner.

In this way, when a shear force which are caused by thermal cycles is operated at the interface between the ceramics substrate and the metal plate, the distortion which is caused by the shear force is absorbed because a crystalline grain is finely miniaturized during the thermal cycles at an area that is from the joint interface of the metal plate to the portions that are away from the joint interface. As a result, propagation of fractures is prevented, and it is thereby possible to manufacture a power module substrate with high reliability.

Here, it is preferable that, a rolled plate be used as the metal plate, the rolled plate be composed of aluminum, and the rolled plate have a degree of purity of aluminum which is greater than or equal to 99.99% in a pre-brazing state.

In the rolled plate that is composed of aluminum and has the degree of purity of aluminum which is greater than or equal to 99.99%, that is, in the rolled plate that is composed of a so-called 4N aluminum, the crystal orientation of the surface of the rolled plate coordinates to a [001] direction and the crystal grows in the [001] direction during a process in which the fused aluminum layer is solidified.

For this reason, the crystal that is adjacent to an interface of the metal plate is oriented in a normal line direction of the interface, that is, in a direction orthogonal to an acting direction in which the shear force is generated during loading caused by thermal cycles; and it is possible to reliably prevent fractures from being propagated at the joint interface or in the vicinity of the joint interface.

In addition, it is preferable that the brazing filler metal be composed of an Al—Si alloy.

Since Si is a chemical element that causes the melting point to be lowered, the brazing temperature is lowered, and it is possible to prevent the metal plate from being fused.

In addition, a power module substrate of the invention includes: a ceramics substrate; a metal plate made of pure aluminum; and a brazing filler metal causing the ceramics substrate to be joined to the metal plate, and including a melting point-lowering element. The concentration of the melting point-lowering element in the metal plate is distributed so as to be gradually lowered depending on being away from a joint interface between the metal plate and the ceramics substrate. A region in which a crystalline grain of [001] orientation oriented in a normal line direction of the joint interface is generated is greater than or equal to 95% of the whole region of the joint interface in the vicinity of the joint interface between the metal plate and the ceramics substrate.

According to the structure of the power module substrate, in the vicinity of the joint interface between the metal plate and the ceramics substrate, since the region in which the crystalline grain of [001] orientation oriented in the normal line direction of the joint interface is generated is greater than or equal to 95% of the whole region of the joint interface. Consequently, a crystalline structure of the ceramics substrate is joined to a crystalline structure of the metal plate in an integrated manner in the vicinity of the joint interface at which they are joined to each other by use of the brazing filler metal.

In this way, when a shear force which is caused by thermal cycles is operated at the interface between the ceramics substrate and the metal plate, the distortion which is caused by the shear force is absorbed because a crystalline grain is finely miniaturized during the thermal cycles at an area that is from the joint interface of the metal plate to the portions that are away from the joint interface, and it is possible to prevent fractures from being propagated at the joint interface or in the vicinity of the joint interface.

Thus, it is possible to improve reliability of the power module substrate.

In addition, the concentration of the melting point-lowering element, that is included in the brazing filler metal, is distributed in metal plate so as to be gradually lowered depending on being away from a joint interface between the metal plate and the ceramics substrate. Consequently, the strength of the metal plate is smoothly changed, portions in which stress concentration is generated do not exist, and it is possible to prevent fractures from being propagated in the metal plate.

Here, it is preferable that the melting point-lowering element be Si.

In this case, by use of an Al—Si based brazing filler metal, it is possible to simply and reliably join the ceramics substrate to the metal plate.

In addition, the degree of hardness in the metal plate changes due to changes in the concentration of Si; however, since the degree of hardness is smoothly changed, the stress concentration is not generated, and it is possible to prevent fractures from being propagated in the metal plate.

A power module of the invention includes: the above-described power module substrate; and an electronic component mounted on the power module substrate.

According to the structure of the power module, it is possible to prevent fractures from being propagated at the joint interface or in the vicinity of the joint interface between the ceramics substrate and the metal plate; even if the usage environment is severe, it is possible to dramatically improve the reliability thereof.

According to the invention, it is possible to provide a method for manufacturing a power module substrate, a power module substrate, and a power module in which the power module substrate is used, where propagation of fractures at a joint interface between the metal plate and the ceramics substrate or in vicinity of the joint interface is prevented, and a high joint strength is obtained.

DESCRIPTION OF THE PREFERRED EMBODIMENTS

Hereinafter, embodiment of the invention will be described with reference to attached drawings.

Figure 1:
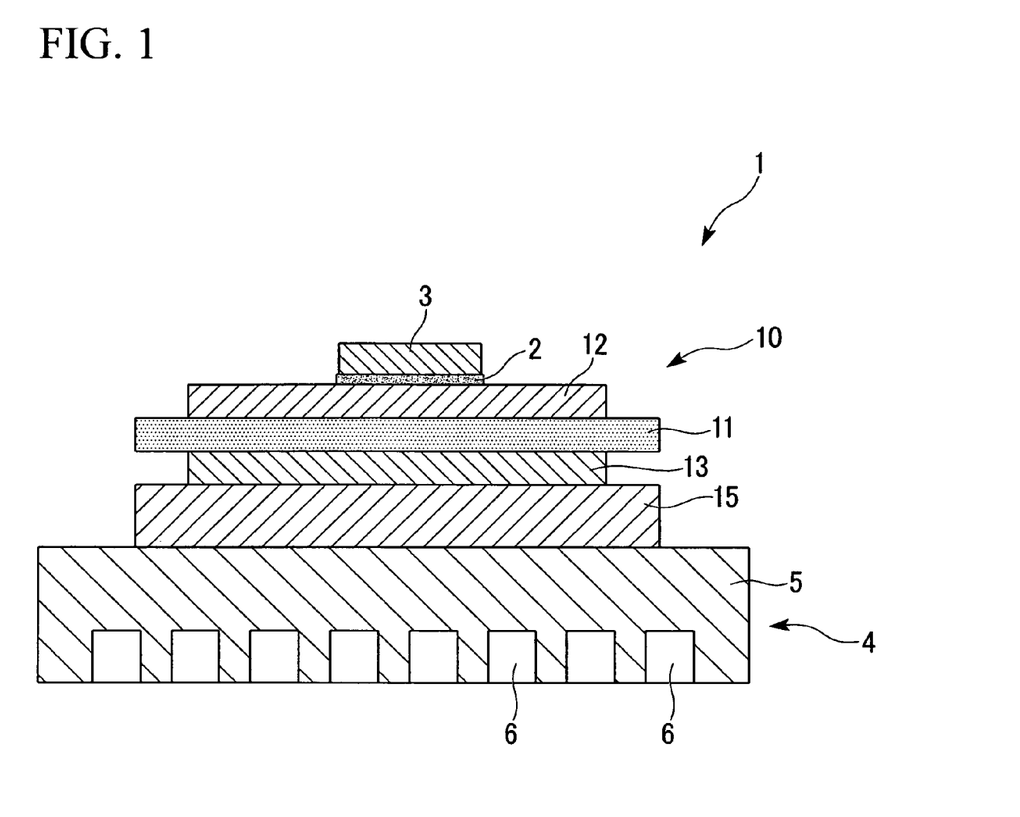
FIG. 1 is a cross-sectional view showing a schematic structure of a power module in which a power module substrate of an embodiment of the invention.

FIG. 1 shows a power module substrate and a power module as an embodiment of the invention.

The power module 1 is provided with a power module substrate 10 on which a circuit layer 12 is disposed, a semiconductor chip 3 to which a top face of the circuit layer 12 is joined via a solder layer 2, and a heatsink 4.

Here, the solder layer 2 is, for example, a Sn—Ag based, a Sn—In based, or a Sn—Ag—Cu based solder material.

Moreover, a Ni-plated layer (not shown) is provided between the circuit layer 12 and the solder layer 2 in the embodiment.

The power module substrate 10 is provided with a ceramics substrate 11, a circuit layer 12 disposed on one face (first face, upper face in FIG. 1) of the ceramics substrate 11, and a metal layer 13 disposed on the other face (second face, lower face in FIG. 1) of the ceramics substrate 11.

The ceramics substrate 11 is a substrate that prevents an electrical connection between the circuit layer 12 and the metal layer 13, made of ceramics having a high insulation property, for example, such as AlN (aluminum nitride) or $Si_3N_4$ (silicon nitride), and made of AlN (aluminum nitride) in the embodiment.

In addition, the thickness of the ceramics substrate 11 is in the range of 0.2 mm to 1.5 mm, and is set to 0.635 mm in the embodiment.

A metal plate 22 having a conductive property is connected to one face of the ceramics substrate 11 by brazing, and the circuit layer 12 is thereby formed.

In the embodiment, the metal plate 22 is made of a rolled plate of aluminum in which the degree of purity is greater than or equal to 99.99% (so-called 4N aluminum), the metal plate 22 is connected to the ceramics substrate 11 by brazing, and the circuit layer 12 is thereby formed.

Figure 2:
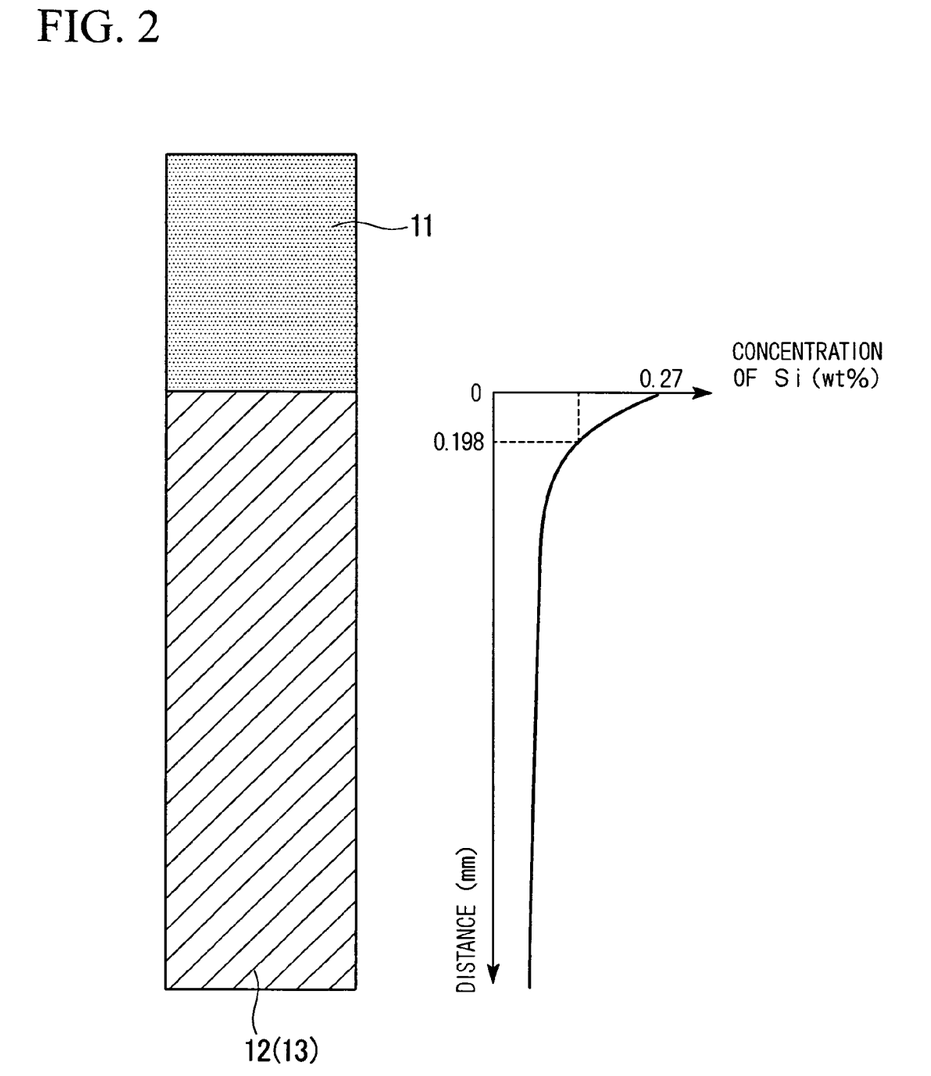
FIG. 2 is an explanatory view showing the concentration distribution of Si in a circuit layer and a metal layer of the power module substrate of the embodiment of the invention.

In the embodiment, an Al—Si based brazing filler metal including Si which serves as a melting point-lowering element is used, Si is diffused by brazing, and the concentration distribution of Si thereby occurs in the circuit layer 12 as shown in FIG. 2.

Namely, the concentration distribution occurs inside the metal layer 13 in a manner in that the concentration of Si decreases with increased distance from the joint interface between the ceramics substrate 11 and the metal layer 13 (circuit layer 12).

In addition, as described below, the average concentration of Si in the joint interface is 0.27 wt %.

In addition, the average of the distance from the joint interface is 0.198 mm at a half value at which the concentration of Si decreases by half.

A metal plate 23 is connected to the other face of the ceramics substrate 11 by brazing, and the metal layer 13 is thereby formed.

In the embodiment, in a manner similar to the circuit layer 12, the metal plate 23 is made of a rolled plate of aluminum in which the degree of purity is greater than or equal to 99.99% (so-called 4N aluminum), the metal plate 23 is connected to the ceramics substrate 11 by brazing, and the metal layer 13 is thereby formed.

In the embodiment, an Al—Si based brazing filler metal is used, Si is diffused by brazing, and the concentration distribution of Si thereby occurs in the metal layer 13 as shown in FIG. 2.

The heatsink 4 is a component that is used for cooling down the above-described power module substrate 10, and provided with a top plate section 5 to which the power module substrate 10 is joined and a flow passage 6 through which a cooling medium (e.g., cooling water) flows.

It is desirable that the heatsink 4 (top plate section 5) be made of a material having excellent thermal conductivity. The heatsink 4 is made of A6063 (aluminum alloy) in the embodiment.

Moreover, a buffering layer 15 made of aluminum or an aluminum alloy is provided between the top plate section 5 of the heatsink 4 and the metal layer 13 in the embodiment.

Consequently, in the power module substrate 10 including the foregoing layered structure, a generation region in which a crystalline grain of [001] orientation oriented in a normal line direction of the joint interface is generated, is greater than or equal to 95% of the whole region of the joint interface, in the range from the joint interface to 90 μm therefrom in the vicinity of the joint interface between the ceramics substrate 11 and the circuit layer 12 (metal plate 22), and in the range from the joint interface to 90 μm therefrom, and in the vicinity of the joint interface between the ceramics substrate 11 and the metal layer 13 (metal plate 23).

In the foregoing power module substrate 10, the metal plate made of pure aluminum is joined to the surface of the ceramics substrate, using the brazing filler metal including the melting point-lowering element.

Specifically, the power module substrate 10 is manufactured as described below.

Figure 3A:
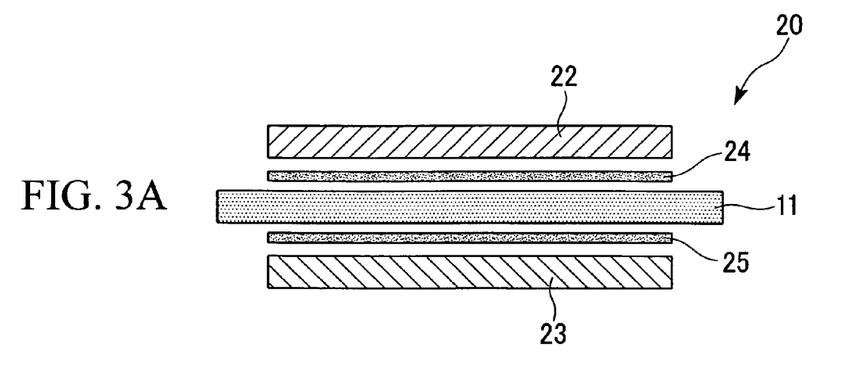
FIG. 3 is a cross-sectional view showing a method for manufacturing a power module substrate of the embodiment of the invention.
Figure 4A:
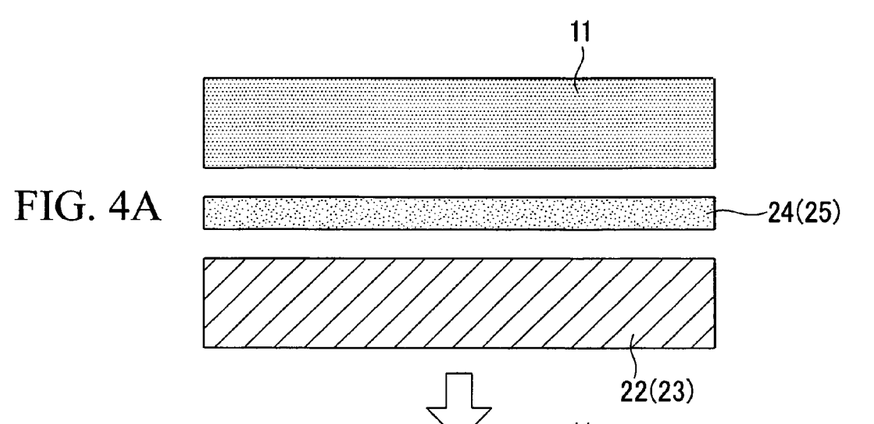
FIG. 4 is a cross-sectional view showing the vicinity of a joint interface between the metal plate and the ceramics substrate shown in FIG. 3.

As shown in FIGS. 3A and 4A, a ceramics substrate 11 made of AlN, a metal plate 22 (rolled plate made of 4N aluminum) that becomes a circuit layer 12, and a metal plate 23 (rolled plate made of 4N aluminum) that becomes a metal layer 13 are prepared.

Figure 3B:
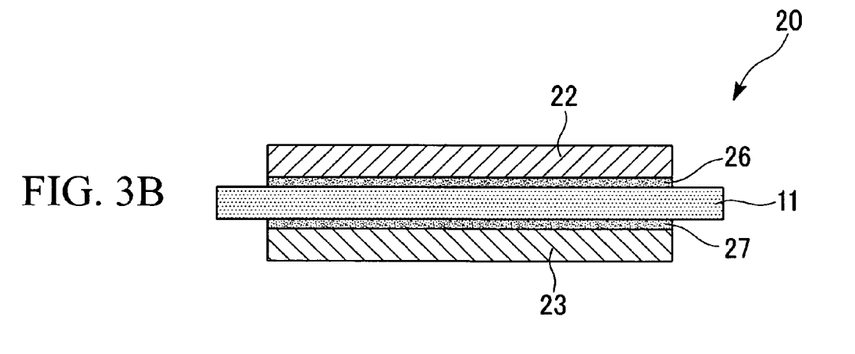

Subsequently, as shown in FIG. 3B, a metal plate 22 having a thickness of 15 μm to 30 μm is stacked on one face of the ceramics substrate 11 with a brazing filler metal foil 24 of 20 μm interposed therebetween in the embodiment.

A metal plate 23 having a thickness of 15 μm to 30 μm is stacked on the other face of the ceramics substrate 11 with a brazing filler metal foil 25 of 20 μm interposed therebetween in the embodiment.

Here, it is preferable that a contained amount of Si included in a composition of the brazing filler metal foils 24 and 25 be 7.5 wt % to 11.0 wt %.

Figure 3C:
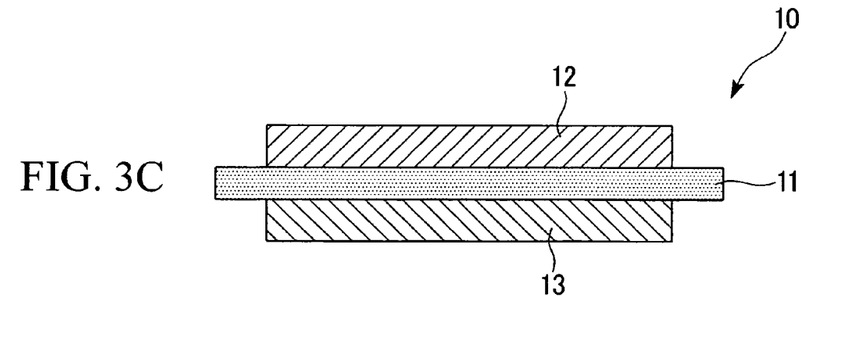
Figure 4B:
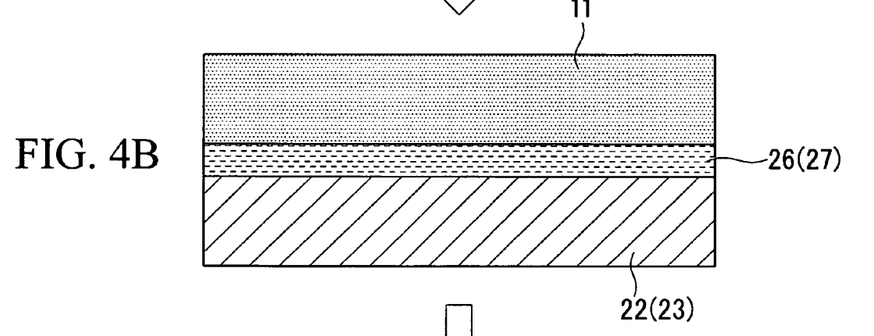

As shown in FIGS. 3C and 4B, a layered body 20 formed in the above-described manner is imported to a vacuum furnace and heated up in a state where the layered body 20 is pressed in a stacked direction, and the brazing filler metal foils 24 and 25 is fused (fusion step).

Here, as a heating condition, the pressure applied to the joint interface is set to be from 2 kgf/cm² to 3 kgf/cm².

In addition, a joint temperature is set to be from 645° C. to 655° C.

As shown in FIG. 4B, a part of the metal plates 22 and 23 that become the circuit layer 12 and the metal layer 13, and the brazing filler metal foils 24 and 25 are fused by the fusion step, and fused aluminum layers 26 and 27 are formed on the surface of the ceramics substrate 1.

Figure 4C:
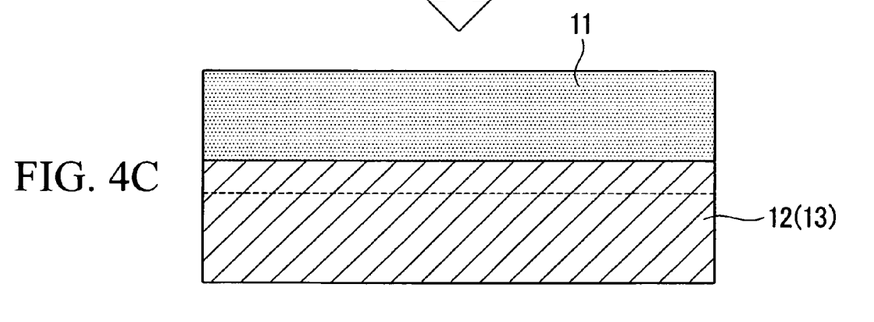

Next, as shown in FIG. 4C, the fused aluminum layers 26 and 27 are solidified by cooling the stacked-layers body 20 (solidifying step).

At this time, a crystal is grown along the crystal orientation of the metal plates 22 and 23 that become the circuit layer 12 and the metal layer 13, and the fused aluminum layers 26 and 27 are thereby solidified.

Here, since the metal plates 22 and 23 that become the circuit layer 12 and the metal layer 13 are made of a rolled plate of 4N aluminum, a crystal that is adjacent to the joint interface between the circuit layer 12 and the metal layer 13, and the ceramics substrate 11 is oriented with [001] orientation in a process of heating up so as to reach a peak temperature.

The power module substrate 10 of the embodiment is manufactured in this manner.

In the power module substrate 10 and the power module 1 of the embodiment including the above-described structure, the metal plates 22 and 23 that become the circuit layer 12 and the metal layer 13 are joined to the ceramics substrate 11 by brazing.

The brazing filler metal foils 24 and 25 that are disposed between the metal plate 22 and the ceramics substrate 11 and between the metal plate 23 and the ceramics substrate 11 are fused by heating, and the fused aluminum layers 26 and 27 are thereby formed.

When the fused aluminum layers 26 and 27 are solidified, since a crystal is grown along the crystal orientation of metal plates 22 and 23, a crystalline grain that is aligned with the crystal of the metal plates 22 and 23 is formed in vicinity of the joint interface between the metal plates 22 and 23, and the ceramics substrate 11. The fused aluminum layers 26 and 27 are joined to the metal plates 22 and 23 in an integrated manner.

As a result, when a shear force which are caused by thermal cycles is operated at the interface between the ceramics substrate 11, the circuit layer 12 and the metal layer 13 (metal plates 22 and 23), the distortion which is caused by the shear force is absorbed because a crystalline grain is finely miniaturized during the thermal cycles at an area that is from the joint interface of the circuit layer 12 and the metal layer 13 (metal plates 22 and 23) to the portions that are away from the joint interface. It is possible to prevent fractures from being propagated at the joint interface or in the vicinity of the joint interface and improve reliability.

Here, the principle that a crystal is finely miniaturized by adding a load caused by thermal cycles is described.

In a case of non-load which is caused by thermal cycles, the diameter of a crystal particle at the joint interface between the ceramics substrate 11 and the circuit layer 12 (metal layer 13) is generally, for example, approximately 0.6 mm, and is relatively large particle diameter.

However, a large shear force is operated at the joint interface as a consequence of applying load which is caused by thermal cycles, and a crystalline grain is gradually and finely miniaturized.

In addition, for focusing attention to the speed of fine-miniaturizing along with the load which is caused by thermal cycles, the speed of fine-miniaturizing in the crystals of [101] orientation and [111] orientation is fast.

That is, when a shear force is operated along with the load which is caused by thermal cycles, the crystals of [101] orientation and [111] orientation preferentially receive the distortion, cracks occur, and fractures are thereby propagated.

As a result, in a conventional power module substrate in which the crystal in the joint interface is aligned along [101] orientation or [111] orientation, since the speed of fine-miniaturizing is fast, a crystalline grain is easily and finely miniaturized, cracks occur along a boundary of the crystal grain that has been finely miniaturized, and there is a problem in that the substrate is easily fractured.

In contrast, the speed of fine-miniaturizing in a crystal of [001] orientation is later than that of the crystal of [101] orientation or [111] orientation.

That is, even if a shear force is operated along with the load which is caused by thermal cycles, it is difficult for the crystal of [001] orientation to receive the distortion caused by a shear force, the fine-miniaturizing for the crystalline grain is suppressed, generation of cracks and propagation of fractures are prevented.

As a result, in the power module substrate of the embodiment in which the crystal in the joint interface is aligned along [001] orientation, even if the crystalline grain is finely miniaturized due to load which is caused by thermal cycles, generation of cracks is suppressed in a boundary of the crystal grain, and fractures are prevented.

In the embodiment, the metal plates 22 and 23 that become the circuit layer 12 and the metal layer 13 are the rolled plate be composed of aluminum, and the rolled plate has a degree of purity greater than or equal to 99.99% in a pre-brazing state (4N aluminum). Therefore, the crystal orientation of the surfaces of the circuit layer 12 and the metal layer 13 is coordinated in a [001] orientation in a process of heating up so as to reach a peak temperature, the fused aluminum layers 26 and 27 are also grown in the direction.

Specifically, the region in which the crystalline grain of [001] orientation oriented in a normal line direction of the joint interface is generated is greater than or equal to 95% of the whole region of the joint interface in the vicinity of the joint interface between the metal plates 22 and 23, and the ceramics substrate 11.

Consequently, the crystal that is adjacent to the interface between the circuit layer 12 and the metal layer 13 (metal plates 22 and 23), and the ceramics substrate 11, is oriented in the normal line direction of the joint interface, that is, in a direction orthogonal to an acting direction in which the shear force is generated by thermal cycles; and it is possible to reliably suppress the fractures that are propagated at the joint interface or in the vicinity of the joint interface during loading caused by thermal cycles.

In addition, as the brazing between the metal plates 22 and 23, and the ceramics substrate 11, an Al—Si based brazing filler metal including Si which serves as a melting point-lowering element is used. In the circuit layer 12 and the metal layer 13, the concentration distribution occurs as shown in FIG. 2 in a manner in that the concentration of Si (melting point-lowering element) decreases with increased distance from the joint interface between the circuit layer 12 and the metal layer 13 (metal plates 22 and 23), and the ceramics substrate 11.

Here, the degree of hardness of the circuit layer 12 and the metal layer 13 (metal plates 22 and 23) changes due to changes in the concentration of Si; however, since the degree of hardness is smoothly changed, portions in which stress concentration is generated do not occur in the circuit layer 12 and the metal layer 13 (metal plates 22 and 23), and it is possible to prevent fractures from being propagated in the circuit layer 12 and the metal layer 13 (metal plates 22 and 23).

While the embodiment of the invention has been described and illustrated above, the technical scope of the invention is not limited to the embodiment, and various modifications may be made without departing from the scope of the invention.

In the above-described embodiment, for example, the case where a substrate made of AlN (aluminum nitride) is used as a ceramics substrate has been described. As a ceramics substrate, a material having an insulation property is used, and may be $Si_3N_4$, $Al_2O_3$, SiC, or the like.

In addition, it is not limited to an Al—Si based brazing filler metal, a brazing filler metal made of an Al—Ge based, an Al—Cu based, an Al—Mg based, or the like may be used.

Furthermore, the case where a heatsink is made of aluminum has been described, however, an aluminum alloy, copper, or a copper alloy may be used.

Furthermore, the case where a heatsink has a flow passage of a cooling medium has been described, however, a structure of the heatsink is not limited to the above-described structure.

Figure 5:
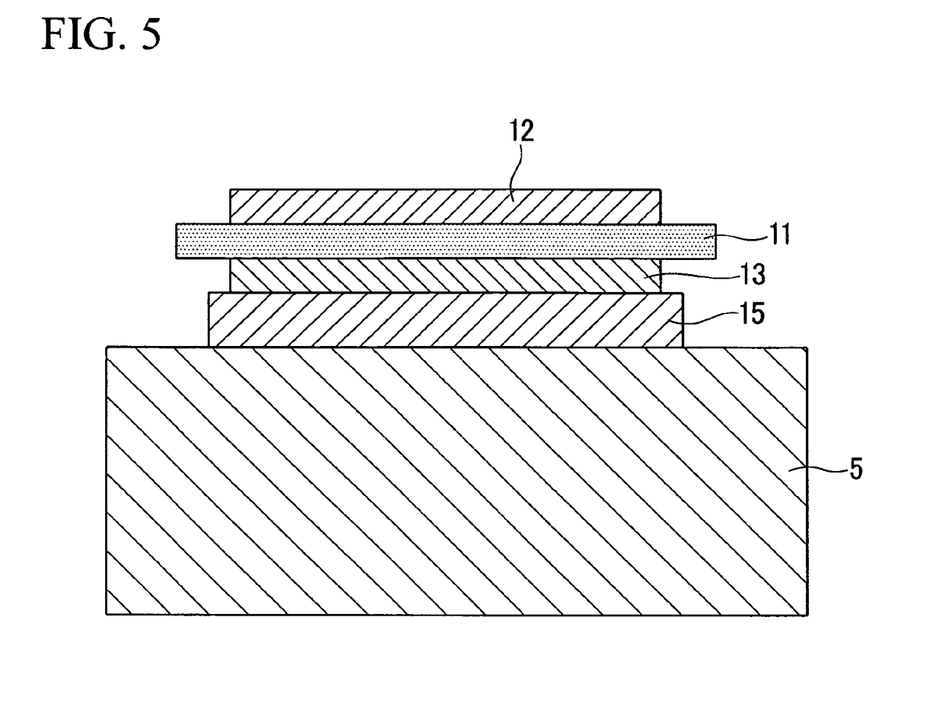
FIG. 5 is a cross-sectional view showing a power module substrate, the substrate is used as a test piece for a comparison experiment in which effectivity of the invention is confirmed.

FIRST EXAMPLE a comparison experiment in which effectivity of the invention is confirmed will be described. FIG. 5 is a cross-sectional view showing a power module substrate used as a test piece for a comparison experiment. The test piece as the power module substrate shown in FIG. 5 includes: a ceramics substrate 11 made of AlN having a thickness of 0.635 mm; a circuit layer 12 made of 4N aluminum having a thickness of 0.6 mm, a metal layer 13 made of 4N aluminum having a thickness of 0.6 mm; a top plate section 5 made of 2N aluminum having a thickness of 5 mm; and a buffering layer 15 made of 4N aluminum having a thickness 1.0 mm. In the comparison experiment, a test piece (hereinafter, refer to "test piece of comparative example") that is obtained by use of a conventional method for manufacturing a power module substrate, and a test piece (hereinafter, refer to "test piece of example") that is obtained by use of a method for manufacturing a power module substrate of the invention are prepared; and a joint interface in each test piece is evaluated and a joint strength in each test piece is measured. Moreover, the test piece of the comparative example is manufactured in a condition in which a thickness of the brazing filler metal is 10 μm to 17 μm, a contained amount of Si included in the brazing filler metal is 5.0 wt % to 7.5 wt %, and a joint temperature is 635° C. to 642° C. In addition, the test piece of the example is manufactured in a condition in which a thickness of the brazing filler metal is 20 μm to 30 μm, a contained amount of Si included in the brazing filler metal is 7.5 wt % to 11.0 wt %, and a joint temperature is 645° C. to 655° C.

Evaluation for Joint Interface

Firstly, an evaluation for a joint interface will be described.

Figure 6:
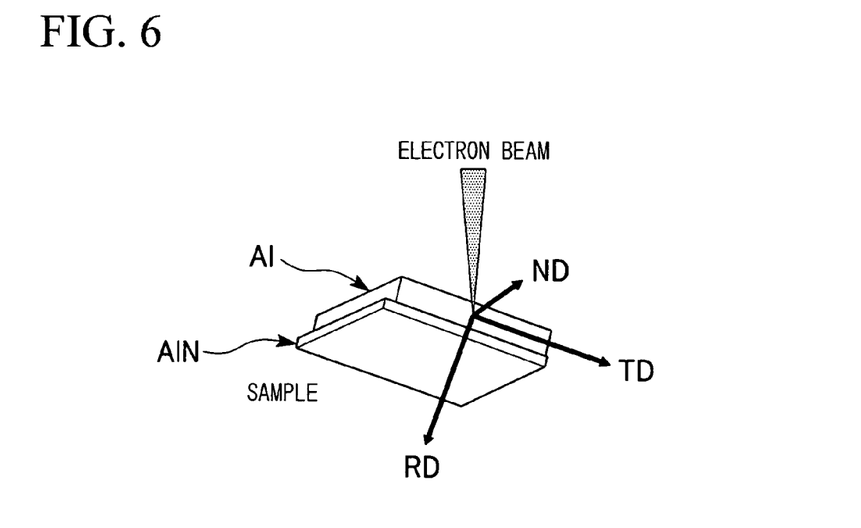
FIG. 6 is a perspective view illustrating an EBSP method in a first example.

In the evaluation for the joint interface, by use of an Electron Back Scatter Diffraction Patterns method (hereinafter, refer to EBSP method), crystal orientation in the vicinity of the joint interface is measured. In the EBSP method, an EBSP detector is connected to a SEM (electron scanning microscope), orientation of a diffraction image (EBSP) for each crystal which is generated when a surface of sample is irradiated with a convergent-electron beam is analyzed, and the crystal orientation of a material is measured based on positional information regarding orientation data and measurement points. The measurement result is indicated as a map of crystal orientation (IPF (Inverse Pole Figure) Map). FIG. 6 illustrates an EBSP method and is a perspective view showing a relative position between an electron beam irradiating a sample and a test piece. Moreover, a sample in which a metal layer made of aluminum (Al) is joined to a ceramics substrate made of aluminum nitride (AlN) is shown in FIG. 6. The sample shown in FIG. 6 is slightly different from the test piece shown in FIG. 5, however, even if the test piece shown in FIG. 5 is evaluated by use of the EBSP method, a test piece is disposed in a manner similar to FIG. 6, and the evaluation is performed by use of the EBSP method.

Next, the measurement condition by use of the EBSP method which is adopted in the above-described comparison experiment will be described. Firstly, an area was measured in the range of W180 μm×90 μm on a face (cross-sectional face) of the sample. In the measuring, a step was 0.6 μm. In the measuring, the measuring time for each point was 0.07 sec/point. In addition, as a condition of SEM, an acceleration voltage was 15 kV, a beam electrical current was approximately 1.2 nA, and a WD was 15 mm. In addition, by working the sample by use of a CP working (condition: 5 kV, 12 hr), a cross-sectional face was formed in a direction orthogonal to the interface between the metal layer (Al) and the ceramics substrate (AlN) in the test piece (sample).

Subsequently, as shown in FIG. 6, the cross-sectional face of the sample is irradiated with an electron beam (convergent electron beam) under the above-described measurement condition, orientation of a diffraction image (EBSP) for each crystal which is generated along with the irradiation of electron beam is analyzed, and the crystal orientation of the material is measured based on positional information regarding orientation data and measurement points. In addition, in the embodiment, diffraction images were obtained in directions of reference numerals "ND" and "RD" as indicated in FIG. 6. In addition, a diffraction image for each of the test piece of the comparative example and the test piece of the example was obtained.

Figure 7A:
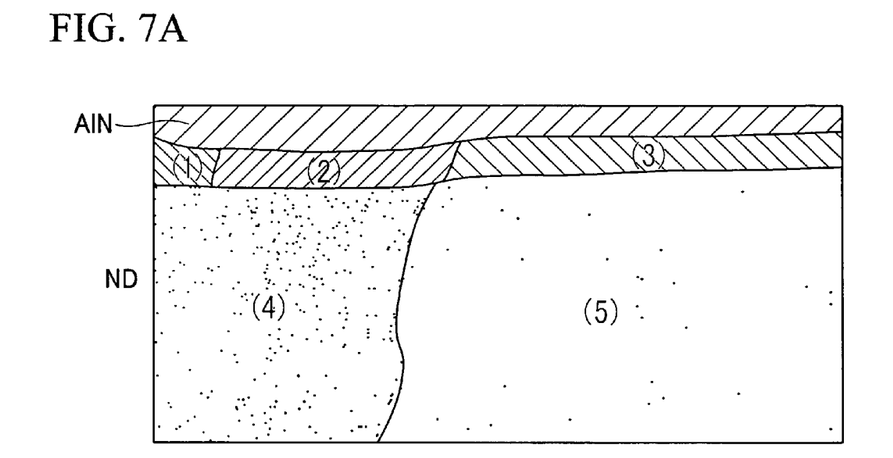
FIG. 7 is a schematic view showing an IPF map obtained by use of the EBSP method.
Figure 7B:
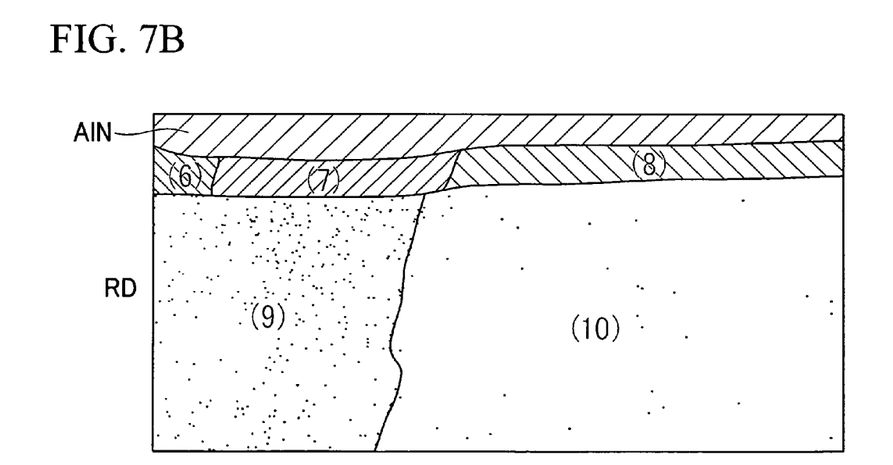
Figure 8A:
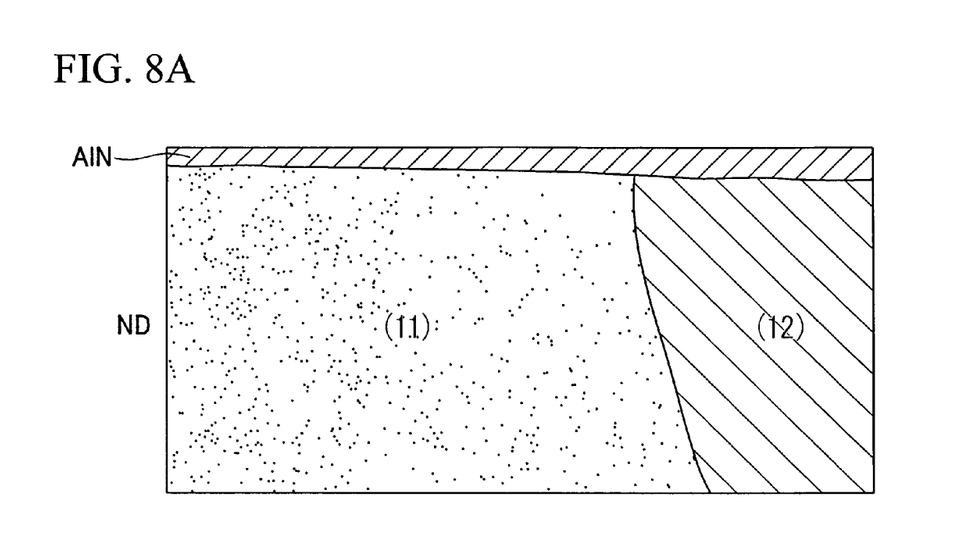
FIG. 8 is a schematic view showing an IPF map obtained by use of the EBSP method.
Figure 8B:
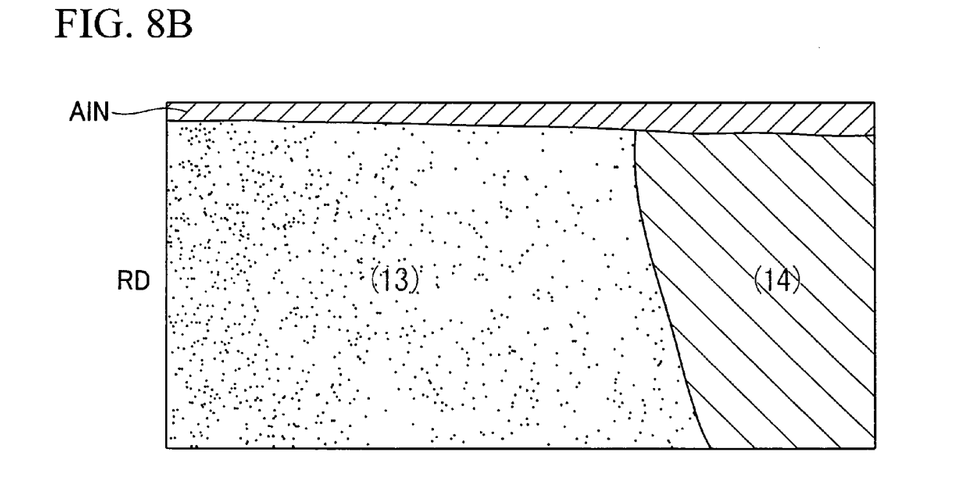

FIGS. 7A, 7B, 8A, and 8B schematically show an IPF map obtained by use of the above-described EBSP method. Generally, in an IPF map obtained by use of an EBSP method, a crystal structure such as orientation of a microscopical grain, distortion of crystal, a crystalline grain group, a state in which a crystalline grain is generated, an array of crystalline grains, is represented by color mapping due to combination of three primary colors that is constituted of red, blue, and green. FIGS. 7A, 7B, 8A, and 8B schematically show crystal orientation in an IPF map by color mapping. FIGS. 7A and 7B show orientation of the crystal that is adjacent to the interface between the metal layer made of Al and the ceramics substrate made of MN in the test piece of the comparative example. In addition, FIG. 7A is a schematic view showing an IPF map based on the diffraction image obtained in the direction indicated by reference numeral "ND" of FIG. 6. In addition, FIG. 7B is a schematic view showing an IPF map based on the diffraction image obtained in the direction indicated by reference numeral "RD" of FIG. 6. FIGS. 8A and 8B show orientation of the crystal that is adjacent to the interface between the metal layer made of Al and the ceramics substrate made of AlN in the test piece of the example. In addition, FIG. 8A is a schematic view showing an IPF map based on the diffraction image obtained in the direction indicated by reference numeral "ND" of FIG. 6. In addition, FIG. 8B is a schematic view showing an IPF map based on the diffraction image obtained in the direction indicated by reference numeral "RD" of FIG. 6.

Firstly, the IPF map of the test piece of the comparative example will be described with reference to FIGS. 7A and 7B.

As shown in the schematic view of the IPF map in FIG. 7A, crystal regions of Al indicated by reference numerals (1) to (5) were distributed in the vicinity of the interface between the metal layer made of Al and the ceramics substrate made of AlN. Here, the region (1) is a region in which crystal of [111] orientation and crystal of [101] orientation are mixed. In addition, the region (2) is a region in which crystal of [111] orientation and crystal of [001] orientation are mixed. In addition, the region (3) is a region of crystal of [101] orientation. In addition, the region (4) is a region in which crystal of [001] orientation exists with a high percentage, however, crystal of [111] orientation and crystal of [101] orientation exist as dots. In addition, the region (5) is a region of crystal of [001] orientation. In addition, as shown in the schematic view of the IPF map in FIG. 7B, crystal regions of Al indicated by reference numerals (6) to (10) were distributed in the vicinity of the interface between the metal layer made of Al and the ceramics substrate made of AlN. Here, the region (6) is a region in which crystal of [111] orientation and crystal of [101] orientation are mixed. In addition, the region (7) is a region in which crystal of [101] orientation and crystal of [001] orientation are mixed. In addition, the region (8) is a region of crystal of [111] orientation. In addition, the region (9) is a region in which crystal of [001] orientation and crystal of orientation are mixed. In the region (9), crystal of [111] orientation and crystal of orientation exist as dots. In addition, the region (5) is a region in which crystal of orientation and crystal of [111] orientation are mixed.

Subsequently, the IPF map of the test piece of the example will be described with reference to FIGS. 8A and 8B.

Figure 9:
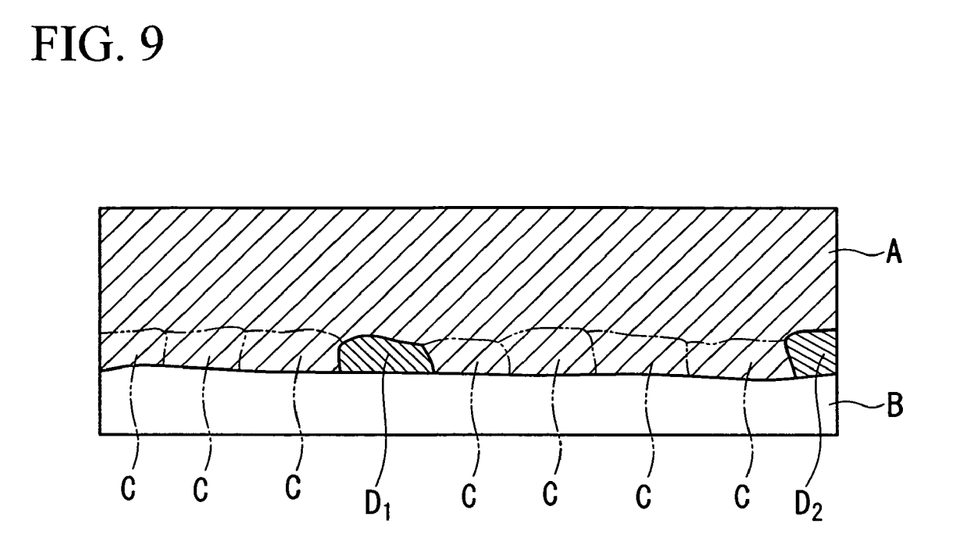
FIG. 9 is a schematic view showing an IPF map obtained by use of the EBSP method.

As shown in the schematic view of the IPF map in FIG. 8A, crystal regions of Al indicated by reference numerals (11) and (12) were distributed in the vicinity of the interface between the metal layer made of Al and the ceramics substrate made of AlN. Here, the region (11) is a region of crystal of [001] orientation, and is a region in which crystal of [111] orientation and crystal of [101] orientation exist as dots. In addition, the region (12) is a region of crystal of [001] orientation. In addition, as shown in the schematic view of the IPF map in FIG. 8B, crystal regions of Al indicated by reference numerals (13) and (14) were distributed in the vicinity of the interface between the metal layer made of Al and the ceramics substrate made of AlN. Here, the region (13) is a region of crystal of [001] orientation, and is a region in which crystal of [111] orientation and crystal of [101] orientation exist as dots. In addition, the region (14) is a region of crystal of [001] orientation. Comparing the test piece of the comparative example and the test piece of the example as described above, as shown in FIGS. 7A and 7B, the regions (1) to (3) and (6) to (8) exist in the test piece of the comparative example. That is, crystal of [111] orientation and crystal of [101] orientation exist with a high percentage at the interface between the metal layer made of Al and the ceramics substrate made of AlN. In other words, crystal of [001] orientation exists very little at the regions (1) to (3) and (6) to (8). In contrast, as shown in FIGS. 8A and 8B, the regions (11) to (14) exist in the test piece of the example. That is, it is seen that crystal of [001]

orientation exist with a high percentage at the interface between the metal layer made of Al and the ceramics substrate made of AlN. In other words, crystal of [111] orientation and crystal of [101] orientation exist very little at the regions (11) to (14). As described above, for focusing attention to the vicinity of the interface at which the metal layer made of Al is joined to the ceramics substrate made of AlN, it is seen that the domain percentage of crystal of [001] orientation included in the test piece of the example is greater than the domain percentage of crystal of [001] orientation included in the test piece of the comparative example. FIG. 9 schematically shows an IPF map obtained by measuring the test piece of the example by use of an EBSP method, the IPF map is different from the portion shown in FIGS. 8A and 8B. In FIG. 9, reference numeral A indicates a portion of the metal plate made of aluminum, a most portions are crystal of [001] orientation. In addition, reference numeral B indicates the ceramics substrate, and a plurality of crystals is lined up in the vicinity of the interface of the ceramics substrate, along the interface; and in the crystals, crystal indicated by reference numeral C is crystal of [001] orientation, each crystal of the other reference numerals D1 and D2 is crystal having orientation that is other than [001].

Calculation for Domain Percentage of Crystal of [001] Orientation

Next, a calculation result of the domain percentage of crystal of [001] orientation included in the test piece of the example will be described. In the method for the calculating the domain percentage, the IPF map of crystal of [001] orientation in the test piece of the example are measured for ten points of sight in the sight range of 180 μm. Based on the measurement result, in the vicinity of the cross-sectional face of the joint interface, a length of the region in which the crystal is generated and in which [001] orientation of the crystal is oriented in the normal line direction of the joint interface is measured relative to reference length. Consequently, based on the length of the region in which the crystal is generated, the domain percentage of the crystal having [001] orientation included was calculated. In addition, at the same time, the average particle diameter of the crystal was measured. Moreover, regarding the crystal orientations, a range of ±5° is considered to be identical orientation.

Consequently, in the test piece of the example, a result is obtained, in which the percentage of the generation region of crystalline grain of [001] orientation that is oriented in the normal line direction of the joint interface is greater than or equal to 95% of the whole region of the joint interface.

Measurement for Joint Strength

Subsequently, measuring for a joint strength will be described. In the measuring the joint strength, firstly, the test piece of the comparative example and the test piece of the example are prepared. As the test piece of the comparative example, test pieces 1 to 3 in which the domain percentages of the crystal of [001] orientation in vicinity of the interface are three of 30%, 45%, and 50% are prepared. In addition, as the test piece of the example, test pieces 1 to 3 in which the domain percentages of the crystal of [001] orientation in vicinity of the interface are 95%, 97%, and 98%, respectively are prepared. A thermal cycles test is performed for each of six test pieces. In the thermal cycles test, a temperature change of −45° C. to 125° C. is one thermal cycle, this thermal cycle is repeated for 4000 times. Subsequently, a junction rate is calculated for each of six test pieces, and the junction rate of each test piece is compared to the others. An evaluation result is indicated in Table 1.

TABLE 1

| | [001] DOMAIN PERCENTAGE | JUNCTION RATE (AFTER 4000 CYCLES) |
|---|---|---|
| COMPARATIVE EXAMPLE 1 | 30% | 40% |
| COMPARATIVE EXAMPLE 2 | 45% | 70% |
| COMPARATIVE EXAMPLE 3 | 50% | 75% |
| EXAMPLE 1 | 95% | 85% |
| EXAMPLE 2 | 97% | 85% |
| EXAMPLE 3 | 98% | 90% |

As evidenced by Table 1, in the comparative examples 1 to 3 in which the domain percentage of crystal oriented in [001] orientation is low, the junction rate is low after the thermal cycles test has been performed, and it is confirmed that reliability of thermal cycles is degraded. In contrast, in the examples 1 to 3 in which the domain percentage of crystal oriented in [001] orientation is greater than or equal to 95%, even if thermal cycles has been performed 4000 times, the junction rate is greater than or equal to 85%, and it is confirmed that the reliability of thermal cycles is improved.

SECOND EXAMPLE

Figure 10A:
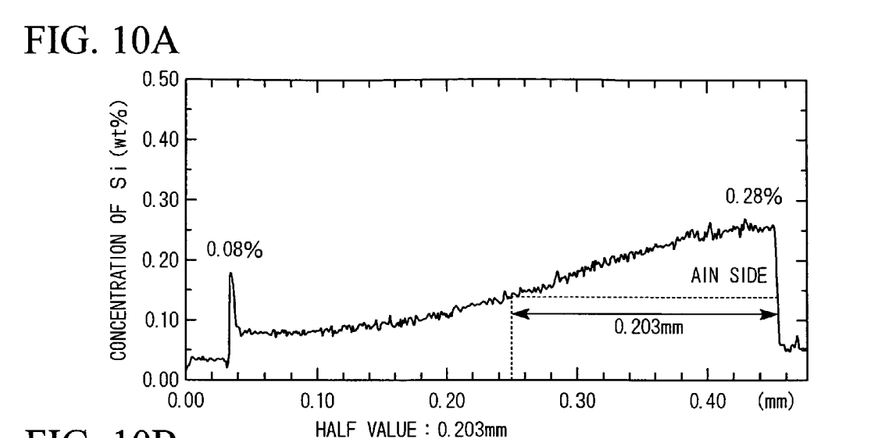
FIG. 10 is a view showing the concentration distribution of Si in a second example.
Figure 10B:
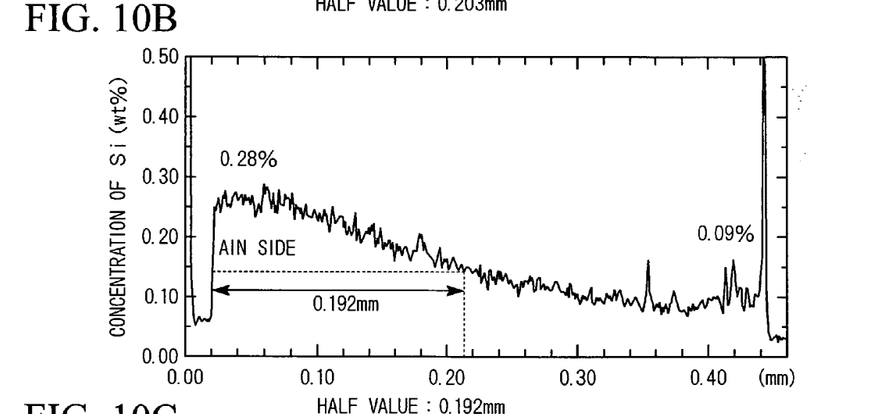
Figure 10C:
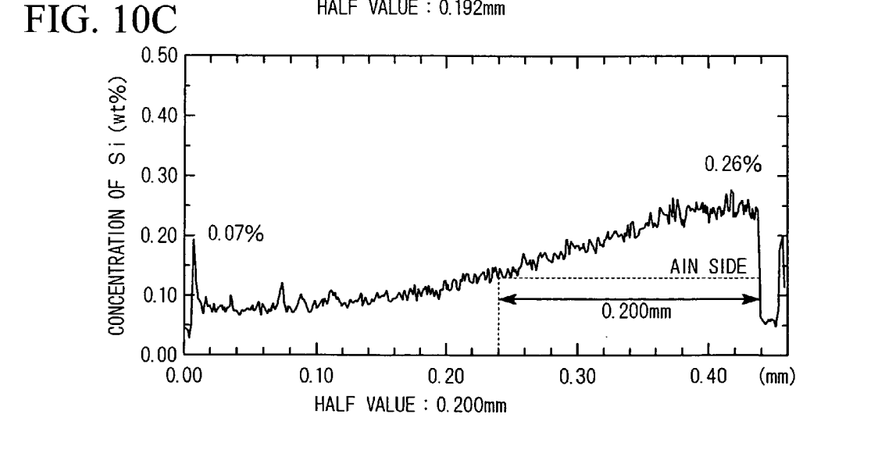

In the second example, a result in which a concentration distribution inside of the metal layer 13 that constitutes the power module substrate of the above-described embodiment is measured will be described. FIGS. 10A to 10C are results (Si-line assay result of DBA) of the concentration distribution of Si in which the concentration of Si decreases with increased distance from the joint interface between the ceramics substrate 11 and the metal layer 13 (circuit layer 12) as shown in FIG. 2 measured by use of an EPMA (Electron Probe Micro Analyzer). In FIGS. 10A to 10C, the axis of abscissas indicates a distance, and the axis of ordinate indicates the concentration of Si. In addition, "AlN side" indicates a position of the joint interface between the ceramics substrate 11 and the metal layer 13, that is, indicates the distance from the joint interface is 0 mm. In addition, the distribution in which the concentration of Si decreases in a left direction of the drawing with increased distance from the joint interface is indicated in FIGS. 10A and 10C. In contrast, the distribution in which the concentration of Si decreases in a right direction of the drawing with increased distance from the joint interface is indicated in FIG. 10B. In all FIGS. 10A to 10C, the concentration distribution of Si that varies in the metal layer 13 with the distance from the joint interface is indicated. In FIG. 10A, a measurement result in which the concentration of Si is 0.28 wt % at the joint interface, and the concentration of Si is 0.08 wt % at the surface of the metal layer 13 (face opposite to the joint interface) is obtained. In addition, a result (measurement result 1) is obtained in which the distance from the joint interface is 0.203 mm at a half value at which the concentration of Si decreases by half. In FIG. 10B, a measurement result in which the concentration of Si is 0.28 wt % at the joint interface, and the concentration of Si is 0.09 wt % at the surface of the metal layer 13 is obtained. In addition, a result (measurement result 2) is obtained in which the distance from the joint interface is 0.192 mm at a half value at which the concentration of Si decreases by half. In FIG. 10C, a measurement result in which the concentration of Si is 0.26 wt % at the joint interface, and the concentration of Si is 0.07 wt % at the surface of the metal layer 13 is obtained. In addition, a result (measurement result 3) is obtained in which the distance from the joint interface is 0.200 mm at a half value at which the concentration of Si decreases by half. The measurement results 1 to 3 are indicated in Table 2.

TABLE 2

|  | CONCENTRATION OF Si AT JOINT INTERFACE (wt %) | CONCENTRATION OF Si AT SURFACE OF METAL LAYER (wt %) | HALF VALUE (mm) |
|---|---|---|---|
| MEASUREMENT RESULT 1 | 0.28 | 0.08 | 0.203 |
| MEASUREMENT RESULT 2 | 0.28 | 0.09 | 0.192 |
| MEASUREMENT RESULT 3 | 0.26 | 0.07 | 0.200 |
| Ave. | 0.27 | 0.08 | 0.198 |

As shown in Table 2, the average concentration of Si (Ave.) is 0.27 wt % at the joint interface. In addition, the average concentration of Si (Ave.) is 0.08 wt % at the surface of the metal layer 13. In addition, a result in which the average distance from the joint interface (Ave.) is 0.198 mm at a half value at which the concentration of Si decreases by half is obtained. As described above, in the power module substrate of the invention, Si included in the brazing filler metal is diffused in vicinity of the interface between the ceramics substrate 11 and the metal layer 13, the concentration of Si is distributed so as to be gradually decreased with increased distance from the ceramics substrate 11.

What is claimed is:

1. A power module substrate, comprising:
   a ceramic substrate;
   a joined metal plate prepared by joining a metal plate made of pure aluminum to the ceramic substrate using a brazing filler metal including a melting point-lowering element, wherein
   the concentration of the melting point-lowering element in the joined metal plate is distributed so as to be gradually lowered depending on being away from a joint interface between the joined metal plate and the ceramics substrate,
   the joined metal plate includes, in the vicinity of the joint interface, a [001] region in which crystalline grains have a crystal orientation [001] oriented in a normal line direction of the joint interface, and a ratio of the [001] region to a whole region at the joint interface is at least 95%.

2. The power module substrate according to claim 1, wherein
   the melting point-lowering element is Si.

3. A power module comprising:
   the power module substrate according to claim 1; and
   an electronic component mounted on the power module substrate.

4. The power module substrate of claim 1, wherein the metal plate of pure aluminum is 99.99% pure Al.

* * * * *